United States Patent

Merritt et al.

[11] Patent Number: 5,528,173
[45] Date of Patent: Jun. 18, 1996

[54] LOW POWER, HIGH SPEED LEVEL SHIFTER

[75] Inventors: Todd Merritt; Troy Manning, both of Boise, Id.

[73] Assignee: Micron Technology, Inc., Boise, Id.

[21] Appl. No.: 438,645

[22] Filed: May 10, 1995

[51] Int. Cl.⁶ .............................................. H03K 19/0175
[52] U.S. Cl. .................................. 326/80; 326/68; 326/81
[58] Field of Search ................................ 326/80, 81, 68, 326/73, 74

[56] References Cited

U.S. PATENT DOCUMENTS

| | | | |
|---|---|---|---|
| 4,897,565 | 1/1990 | Shimizu | 326/80 |
| 4,920,284 | 4/1990 | Denda | 326/68 |
| 4,977,339 | 12/1990 | Denda | 326/80 |
| 5,225,721 | 7/1993 | Gal | 326/81 |
| 5,451,888 | 9/1995 | Shimada | 326/80 |

Primary Examiner—Edward P. Westin
Assistant Examiner—Andrew Sanders
Attorney, Agent, or Firm—Schwegman, Lundberg, Woessner & Kluth

[57] ABSTRACT

A voltage level translator is disclosed which translates a CMOS input signal into a CMOS output signal where the low voltage level of the output signal is equal to the high voltage level of the input signal. The voltage level translator is described in an integrated circuit such as memory circuits, including DRAMs. Specifically, the voltage level translator produces an output signal which can be used as a gate voltage on a pre-charge transistor for a booted circuit where the gate voltage need only drop to the high voltage level of the input signal to shut the transistor off. The voltage level translator described, therefore, reduces the time and power required to translate an input signal by limiting the voltage swing of the output signal.

13 Claims, 6 Drawing Sheets

LOW POWER, HIGH SPEED LEVEL SHIFTER

TECHNICAL FIELD OF THE INVENTION

The present invention relates generally to integrated circuits and in particular the present invention relates to voltage level translators fabricated thereon.

BACKGROUND OF THE INVENTION

There are instances in integrated circuit design where voltage level translators are needed to interface between circuits requiring different voltage levels. For example, many integrated circuits such as DRAMs operate in a voltage range <4 volts, but require voltage swings >4 volts to interface with external circuits or provide signals to other circuits included with the DRAM.

Two primary objectives of any voltage level translator are the reduction in time required to translate an input signal and the power requirements to complete the translation. A CMOS voltage translator described in U.S. Pat. No. 5,136,190 entitled "CMOS Voltage Level Translator Circuit" issued to Chern et al., addresses these two objectives. The Chern et al. patent describes a circuit which provides an interface between circuitry where control signals are between Vcc and Vss to circuits using signals between Vcc' and Vss. Specifically, the Chern et al. level translator works in integrated circuits where Vcc is <4 volts and Vcc' is >4 volts.

Although the Chern et al. patent provides a fast, efficient level translator, it fails to address interfaces requiring voltage swings between a supply voltage (Vcc) and some higher voltage (Vccp). That is, Chern et al. describes a level translator which translates an input voltage swing from ground (Vss) to supply (Vcc) into an output voltage swing from Vss to Vccp. This translator is relatively slow and wastes power in interfacing with a circuit which requires an input voltage swing between Vcc and Vccp. It can be seen that the transition time and power required to move the output voltage between Vss and Vcc is an unnecessary use of resources.

For the reasons stated above, and for other reasons stated below which will become apparent to those skilled in the art upon reading and understanding the present specification, there is a need in the art for an integrated circuit voltage level translator which can translate an input voltage signal into an output voltage signal where the minimum output voltage level is substantially equal to the maximum input voltage level.

SUMMARY OF THE INVENTION

The above mentioned problems with voltage level translators and other problems are addressed by the present invention and which will be understood by reading and studying the following specification. A level translator is described which provides an output voltage between a supply Vcc and a higher pump voltage Vccp.

In particular, the present invention describes a voltage level translator which comprises an input connection for receiving an input signal having a first upper voltage level and a first lower voltage level, and a circuit for producing an output signal in response to the input signal and having a second upper voltage level and a second lower voltage level substantially equal to the first upper voltage level.

The voltage level translator can further comprise an input stage and an output stage. The input stage produces first and second intermediate outputs, where the first intermediate output is at the first lower voltage level when the input signal is at the first lower voltage level, and the second intermediate output is at the first lower voltage level when the input signal is at the first upper voltage level. The output stage produces the output signal at the second upper voltage level when the first intermediate output is at the first lower voltage level, and at the first upper voltage level when the second intermediate output is at the first lower voltage level.

In another embodiment, the voltage level translator can comprise a first p-channel transistor having its gate connected to the first intermediate output, its source electrically connected to the second upper voltage level, and its drain connected to a source of a second p-channel transistor. The second p-channel transistor has its gate connected to the second intermediate output, and its drain electrically connected to the first upper voltage level. The voltage level translator also comprises an output line connected to the drain of the first p-channel transistor.

In another embodiment, the voltage level translator can have an input stage comprising of first and second p-channel transistors. The first p-channel transistor has its source electrically connected to the second upper voltage level, and its drain electrically connected to a substantially equal electrical state of the input signal to provide the second intermediate output. The second p-channel transistor has its source electrically connected to the second upper voltage level, its gate connected to the drain of the first p-channel transistor, and its drain connected to the gate of the first p-channel transistor and electrically connected to a substantially opposite electrical state of the input signal to provide the first intermediate output.

Further, the voltage level translator can have an input stage having an inverter connected to the input connection for receiving the input signal. The inverter allows the voltage level translator to produce an output which is inverted with respect to the input signal and has a voltage swing between the supply voltage and a higher pump voltage.

In still another embodiment, an integrated circuit operating at a first supply voltage level provided by an external power supply comprises an internal power supply providing a second supply voltage level, a voltage level translator and an additional circuit, such as a boot circuit, for receiving the output signal from the voltage level translator. The voltage level translator comprises an input connection for receiving an input signal having a first upper signal voltage level equal to the first supply voltage level and a first lower voltage level, and a circuit for producing an output signal in response to the input signal and having a second upper voltage level equal to the second supply voltage level and a second lower voltage level equal to the first upper voltage level.

DETAILED DESCRIPTION OF THE INVENTION

In the following detailed description of the preferred embodiment, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Each transistor described herein is either a P-channel or N-channel field-effect transistor (FET) having a gate, a first current node (drain) and a second current node (source). Since an FET is typically a symmetrical device, the true designation of "source" and "drain" is only possible once a voltage is impressed on the terminals. The designations of source and drain herein should be interpreted, therefore, in the broadest sense.

Figure 1:
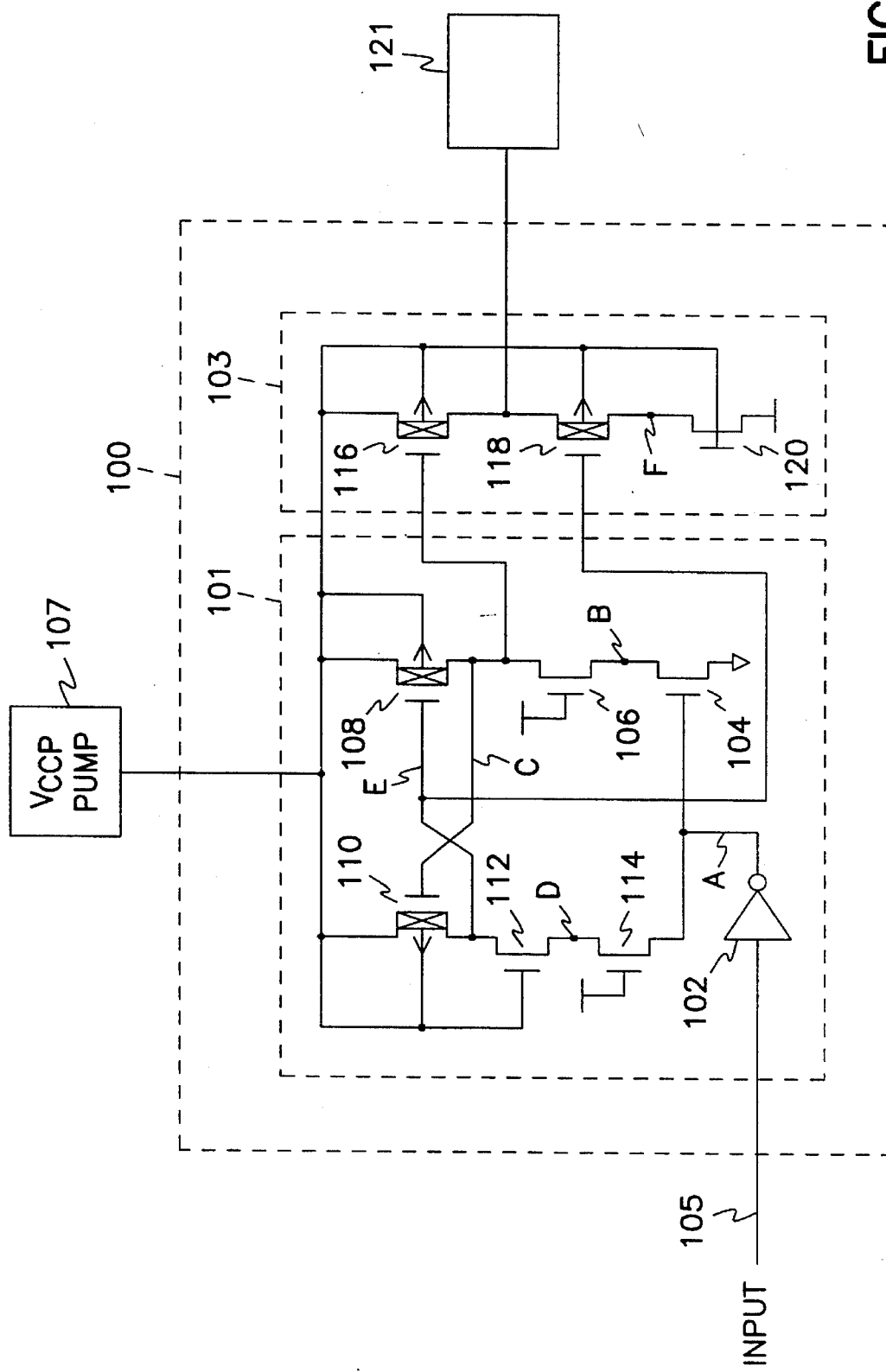
FIG. 1 is a schematic of a voltage level translator.

Referring to FIG. 1, one embodiment of the voltage level translator 100 of the present invention is described. The voltage level translator 100 is comprised of an input stage 101 and an output stage 103. The level translator provides an optional inverter 102 having an input connector 105 to receive a CMOS input voltage signal. The output (node A) of the inverter is connected to the gate of N-channel transistor 104. N-channel transistor 106, having its gate connected to the integrated circuit supply voltage (Vcc), is connected between P-channel transistor 108 and transistor 104 (Node B). The gate of transistor 108 (Node E) is connected to the drain of P-channel transistor 110, which in turn has its gate (Node C) connected to the drain of transistor 108. Both transistors 108 and 110 have their sources connected to a voltage source Vccp, which has a higher voltage potential than Vcc. It will be understood that Vccp can be provided by any supply, including a voltage pump circuit 107. The Vccp pump is provided on the integrated circuit and produces a higher voltage using the Vcc supply voltage, as known to one skilled in the art.

The drain of transistor 110 is connected to the source of N-channel transistor 112. Transistor 112 has its gate connected to Vccp and its drain (Node D) connected to N-channel transistor 114. The gate of transistor 114 is connected to Vcc, while the drain is connected to the output (Node A) of inverter 102.

P-channel transistor 116 is connected such that its gate is connected to Node C and its source is connected to Vccp. Node C and E are referred herein as intermediate outputs of input stage 101. Further, the drain of transistor 116 is connected to the source of P-channel transistor 118. This connection provides the output signal from the voltage level translator 100 and is connected to some additional circuit 121 as further described below.

Transistor 118 has its gate connected to Node E and its drain (Node F) is connected to N-channel transistor 120. Finally, the gate of transistor 120 is connected to Vccp and the drain is connected to Vcc.

Figure 2:
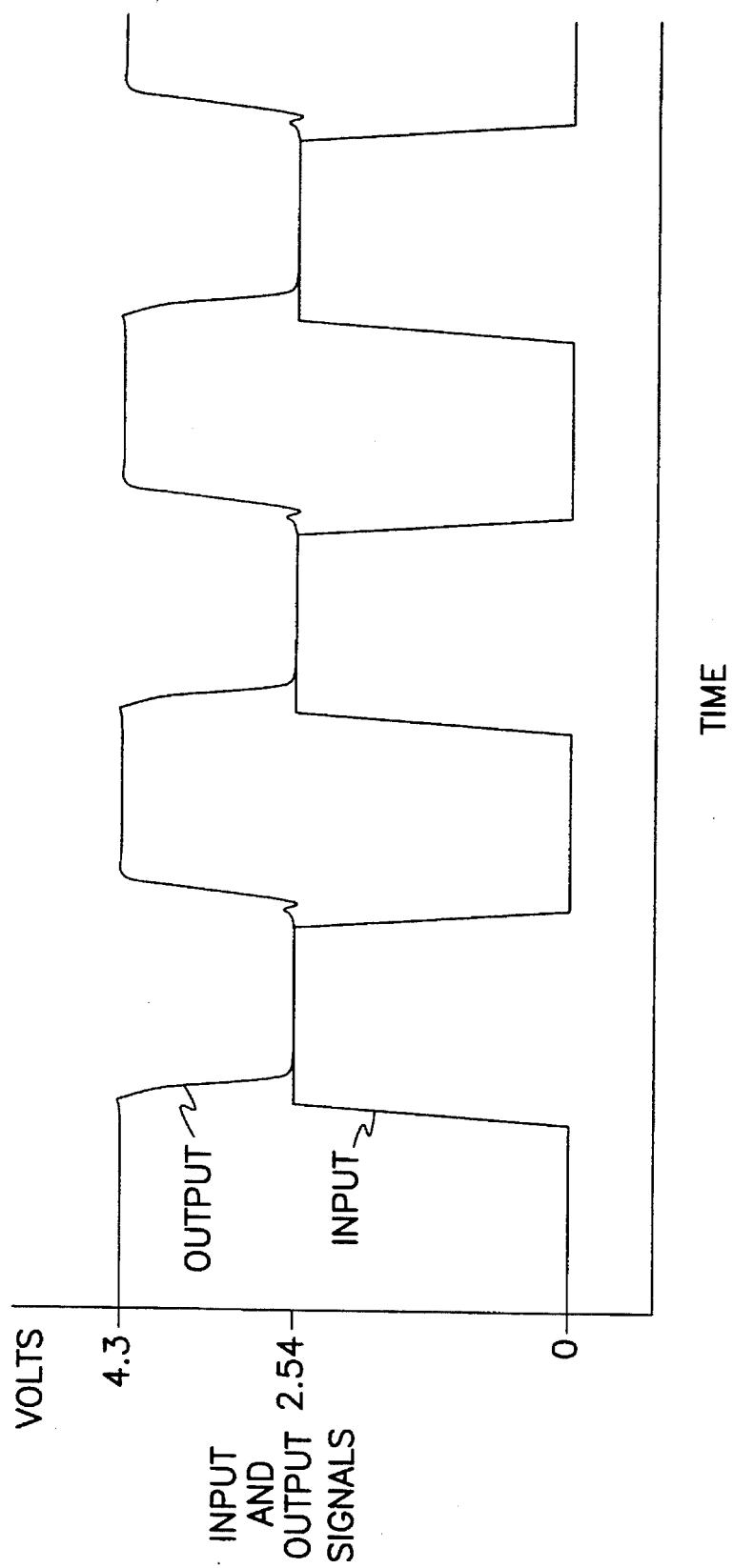
FIG. 2 is a graph showing the input and output voltages of the voltage level translator of FIG. 1.

In operation, the circuit shown in FIG. 1 and described above produces an output substantially as shown in FIG. 2. The input signal shown is a substantially square wave having a low voltage level of 0 and a high voltage level of 2.54 volts. The output signal is a substantially square wave, inverse to the input signal and having a voltage swing between 2.54 and 4.3 volts.

Figure 3:
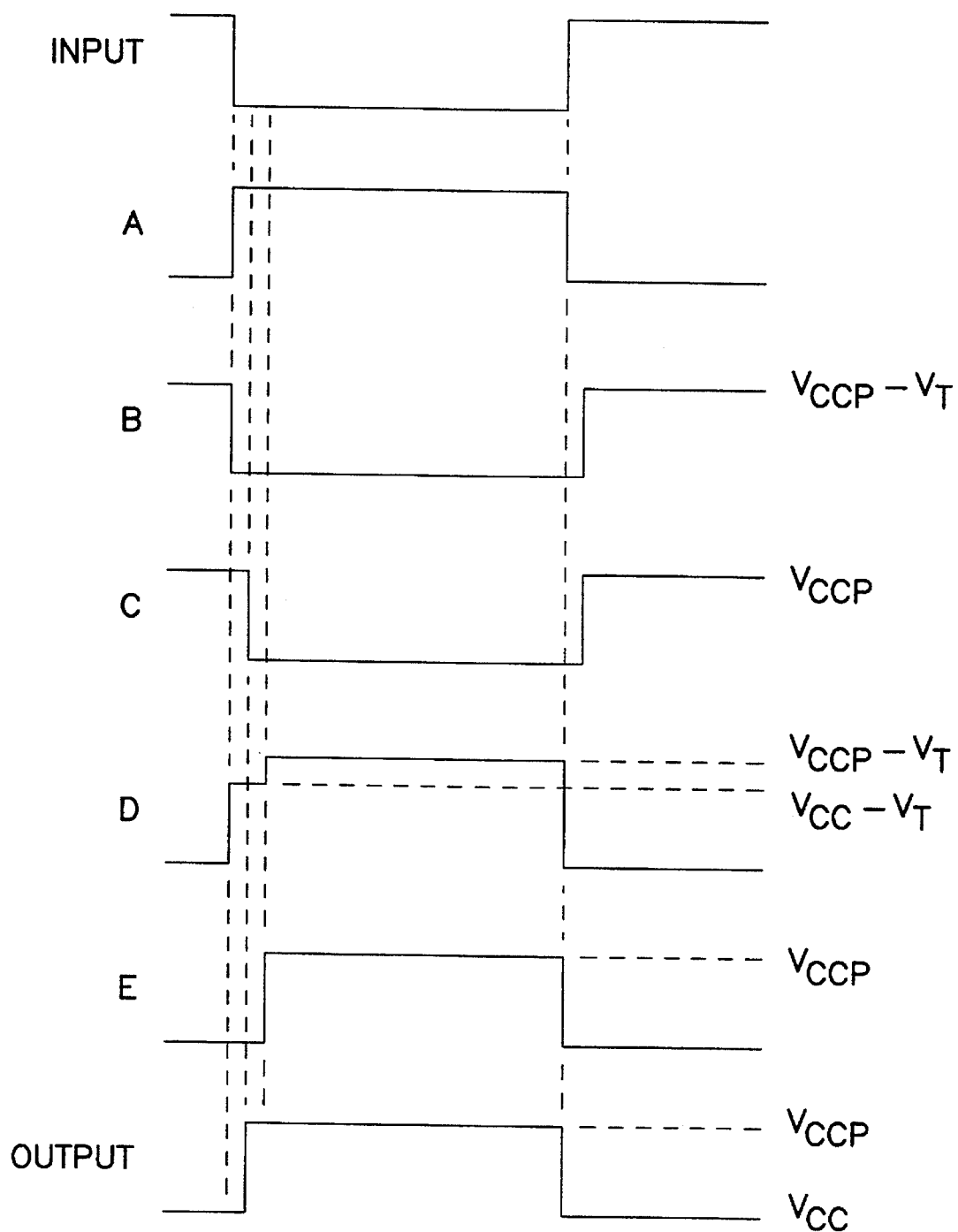
FIG. 3 is a timing diagram of selected modes of the voltage level translator of FIG. 1.

With reference to the circuit of FIG. 1 and the timing diagram of FIG. 3 the operation of the voltage level translator of the present invention will be described. When the state of an input signal to inverter 102 goes from a high voltage to a low voltage, Node A goes from a low voltage to a high voltage. This transition turns on transistor 104, thereby pulling Node B low. Node C is also pulled low through transistors 106 and 104. Node D is initially pulled high through transistor 114 to a voltage of Vcc-Vt, where Vt is the transistor threshold voltage of approximately 0.7 volts. Transistor 110 is activated when Node C goes low and pulls Node E to Vccp. By increasing Node E to Vccp, Node D also increases to Vccp-Vt. Both transistors 108 and 118 are turned off when Node E goes to Vccp. Similarly, Transistor 116 turns on when Node C goes low, thereby making the output signal go high to Vccp.

The output voltage remains at Vccp until the input signal changes state. When the input voltage signal goes from a low to a high state, the output of inverter 102, or Node A, goes low. Transistor 104 is turned off and Node D is pulled low through transistor 114. Node E is also pulled low through transistor 112 as Nodes A and D go low. Transistor 118 is turned on when Node E goes low, thereby, pulling the output signal to Vcc. As Node E is pulled low, transistor 108 is turned on so that Node C is pulled high to Vccp, transistors 110 and 116 are turned off and Node B is, therefore, pulled high to Vcc-Vt. With the gate and drain of transistor 120 connected to Vccp and Vcc, respectively, Node F is always held at Vcc.

Figure 4:
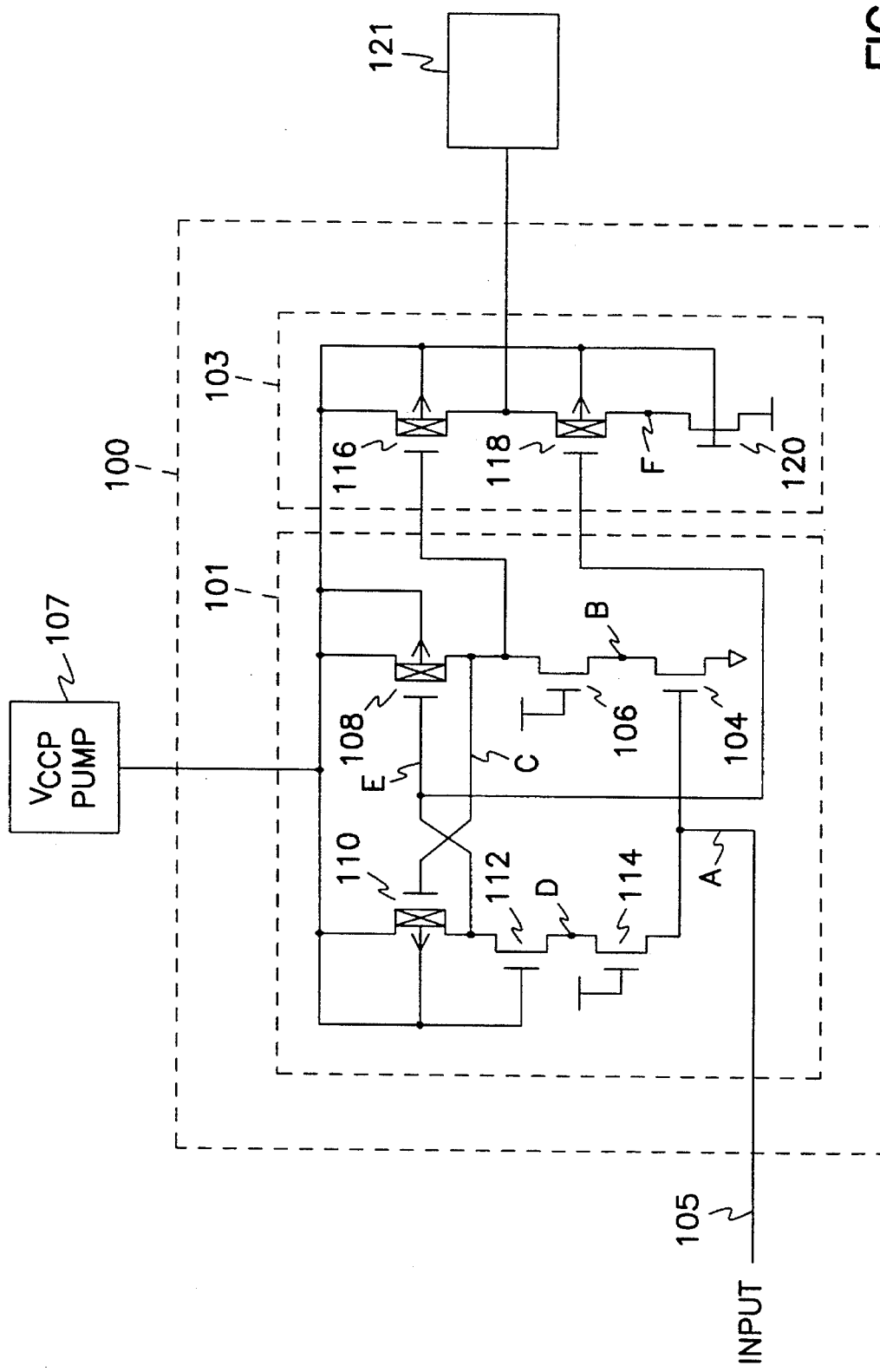
FIG. 4 is a schematic of an alternate voltage level translator incorporating the present invention.
Figure 5:
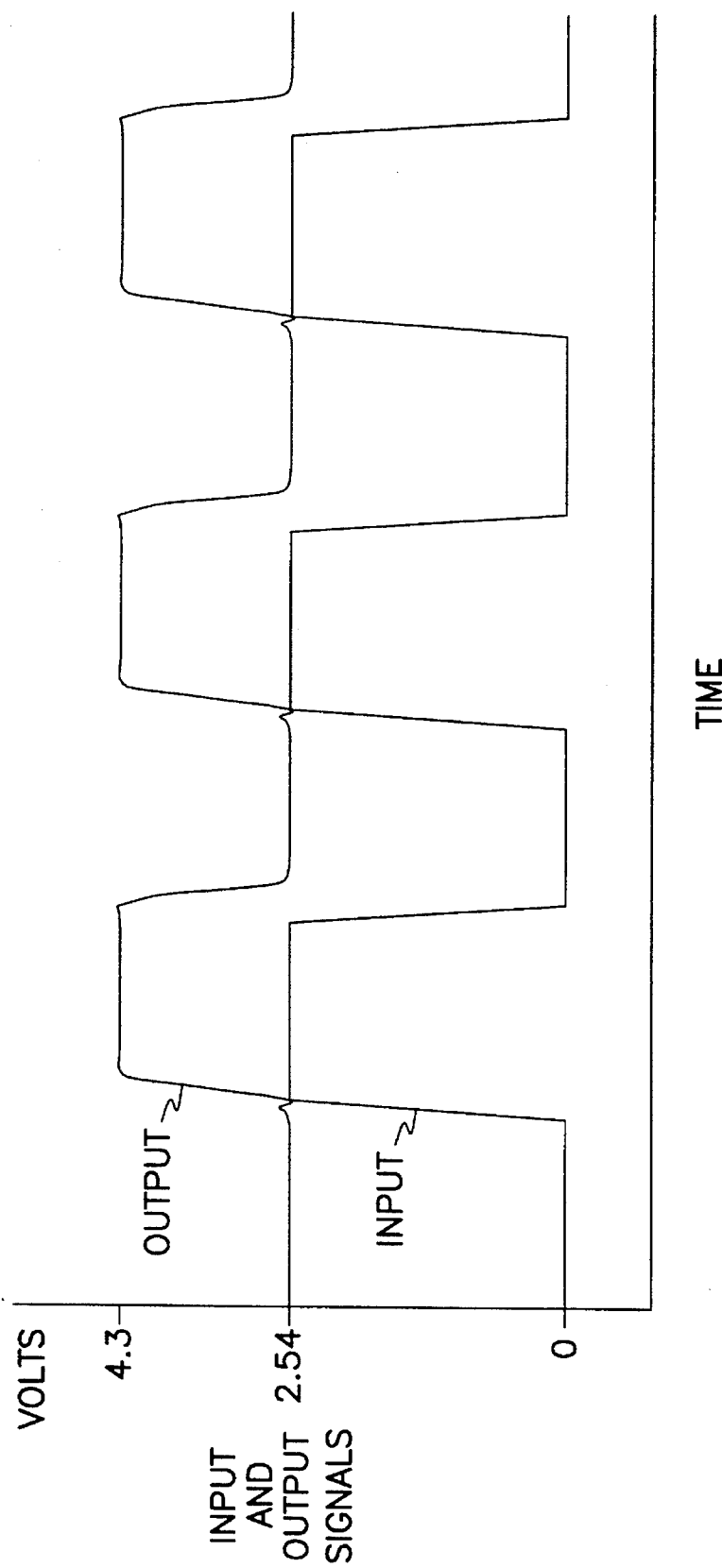
FIG. 5 is a graph showing input and output voltages of the voltage level translator of FIG. 4.

Typical values for Vcc and Vccp are 3 and 4.5 volts, respectively. It will be understood that other voltage levels are contemplated without limiting the scope of the invention. As stated above, inverter 102 is optional. FIG. 4 and 5 show both an alternative voltage level translator schematic without inverter 102 and the resulting output.

Figure 6:
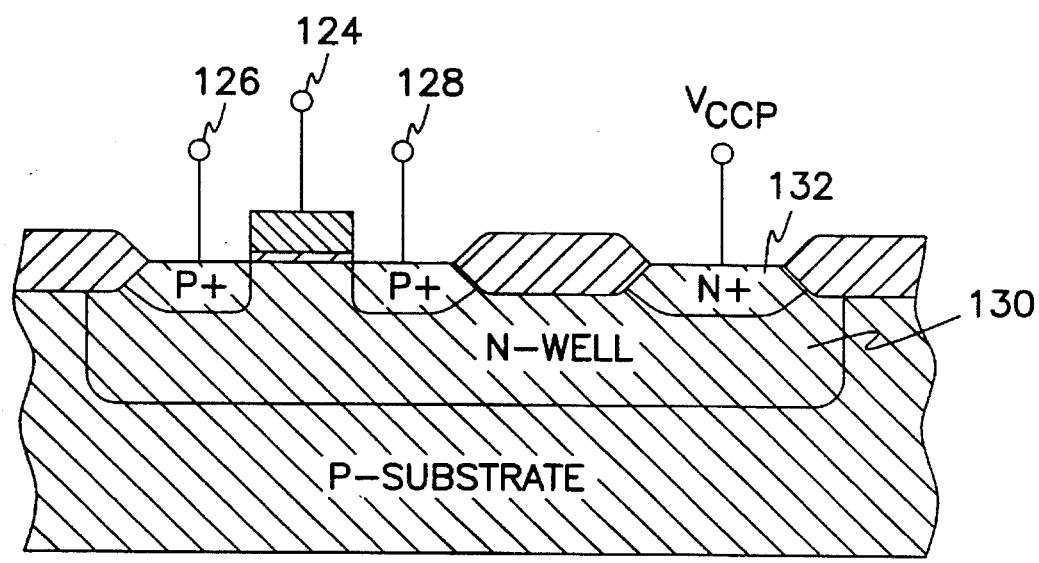
FIG. 6 is a cross-sectional view of a P-channel transistor which may be used in the present invention.

Transistors 108, 110, 116 and 118 are p-channel transistors fabricated as an integrated circuit such that their n-well is connected to Vccp. Referring to FIG. 6, a typical p-channel transistor is shown formed as an integrated circuit having a gate 124, source 126, drain 128 and a n-channel 130 connected to Vccp through a N+ region 132. It will be understood that different P-channel structures are contemplated and this example is not intended to limit the present invention.

N-channel transistors 106, 112 and 114 are used as isolation devices and are useful to prevent latch-up. Transistor 106 prevents a large source to drain voltage from occurring across transistor 104. Specifically, as Node C approaches Vccp Node B also approaches Vccp. However, with the gate of transistor 106 connected to Vcc, the transistor will turn off when Node B is at Vcc-Vt. Transistor 106, therefor, prevents the source voltage of transistor 104 from reaching Vccp.

Transistor 114 is used to prevent the inverter 102 from becoming latched-up. That is, the p-channel device in inverter 102 will be forward biased if the inverter output voltage at Node A exceeds Vcc. Transistor 114 operates in the same manner as transistor 106. Transistor 114 will shut off when its drain voltage approaches Vcc-Vt. Node A. However, can be driven to Vcc when the inverter input is low.

Transistor 112 is used to prevent forward biasing transistor 110 during power-up. Both power supplies. Vcc and Vccp, reach their maximum level at different times during power-up. Because Vccp is generated using an on-chip pump generator and Vcc is an external power supply. Vcc will reach its maximum level first. If the drain voltage of transistor 110 exceeds its well voltage (Vccp), the transistor would latch-up. Therefore, transistor 112 holds the drain of transistor 110 below Vccp. Specifically, transistor 112 will shut off if Node D exceeds Vccp-Vt during power-up. Further, it will be understood that transistor 120 protects transistor 118 in a similar manner during power-up. That is, transistor 120 does not allow Node F to exceed Vccp-Vt.

Conclusion

The present invention provides a voltage level translator capable of translating a CMOS input signal into a CMOS output signal where the low voltage level of the output signal is equal to the high voltage level of the input signal. This output signal is particularly useful in memory circuits, such as DRAMs. Specifically, the present invention can be used to produce an output signal used as a gate voltage on a pre-charge transistor for a booted buffer. The pre-charge transistor has a drain voltage of Vcc, therefore, the gate voltage need only drop to Vcc to shut the pre-charge transistor off. Additional circuit 121 can be any variety of circuits including but not limited to; a booted output buffer, row or address decoders, or level translated device. The present invention, therefore, reduces the time and power required to translate an input signal by limiting the voltage swing of the output.

What is claimed is:

1. A voltage level translator comprising:

an input connection receiving an input signal having a first upper voltage level and a first lower voltage level;

an input stage producing first and second intermediate outputs, the first intermediate output being at the first lower voltage level when the input signal is at the first lower voltage level, the second intermediate output being at the first lower voltage level when the input signal is at the first upper voltage level; and an output stage producing a output signal in response to the input signal, the output signal being at the second upper voltage level when the first intermediate output is at the first lower voltage level, and at the first upper voltage level when the second intermediate output is at the first lower voltage level, the output stage comprising:

a first p-channel transistor having its gate connected to the first intermediate output, its source electrically connected to the second upper voltage level, and its drain connected to a source of a second p-channel transistor, the second p-channel transistor having its gate connected to the second intermediate output, and its drain electrically connected to the first upper voltage level, and an output line connected to the drain of the first p-channel transistor.

2. The voltage level translator of claim 1 wherein, comprises:

the second p-channel transistor has its drain electrically connected to a source of an n-channel transistor; and the n-channel transistor having a gate connected to the second upper voltage level, and a drain connected to the first upper voltage level.

3. The voltage level translator of claim 1 where the input stage comprises:

a first p-channel transistor having its source electrically connected to the second upper voltage level, and its drain electrically connected to a substantially equal electrical state of the input signal to provide the second intermediate output; and a second p-channel transistor having its source electrically connected to the second upper voltage level, its gate connected to the drain of the first p-channel transistor, and its drain connected to the gate of the first p-channel transistor and electrically connected to a substantially opposite electrical state of the input signal to provide the first intermediate output.

4. The voltage level translator of claim 3 where the input stage further comprises an n-channel transistor having its gate connected to the second upper voltage level and its source connected to the drain of the first p-channel transistor.

5. The voltage level translator of claim 1 where the input stage comprises:

an inverter having an input connected to the input connection for receiving the input signal;

a first p-channel transistor having its source electrically connected to the second upper voltage level, and its drain electrically connected to a substantially opposite electrical state of the input signal to provide the second intermediate output; and a second p-channel transistor having its source electrically connected to the second upper voltage level, its gate connected to the drain of the first p-channel transistor, and its drain connected to the gate of the first p-channel transistor and electrically connected to a substantially equal electrical state of the input signal to provide the first intermediate output; and an n-channel transistor having its gate connected to the first upper voltage level and its drain connected to an output of the inverter.

6. The voltage level translator of claim 5 where the input stage further comprises:

a first n-channel transistor having its gate connected to an output of the inverter, its drain connected to the first lower voltage level, and its source connected to a drain of a second n-channel transistor;

the second n-channel transistor having its gate connected to the first upper voltage level, such that a source voltage of the first n-channel transistor does not exceed the first upper voltage level.

7. An integrated circuit operating at a first supply voltage level provided by an external power supply comprising:

an internal power supply providing a second supply voltage level;

a voltage level translator comprising an input connection for receiving an input signal having a first upper signal voltage level equal to the first supply voltage level and a first lower voltage level;

an input stage producing first and second intermediate outputs, the first intermediate output being at the first lower voltage level when the input signal is at the first lower voltage level, the second intermediate output being at the first lower voltage level when the input signal is at the first upper voltage level;

an output stage producing the output signal in response to the input signal, the output signal being at a second upper voltage level equal to the second supply voltage when the first intermediate output is at the first lower voltage level, and at the first upper voltage level when the second intermediate output is at the first lower voltage level;

an additional circuit for receiving the output signal;

a first p-channel transistor having its gate connected to the first intermediate output, its source electrically connected to the second upper voltage level, and its drain connected to a source of a second p-channel transistor;

the second p-channel transistor having its gate connected to the second intermediate output, and its drain electrically connected to the first upper voltage level; and an output line connected to the drain of the first p-channel transistor.

8. The integrated circuit of claim 7 wherein, the second p-channel transistor has its drain electrically connected to a source of an n-channel transistor; and the n-channel transistor having a gate connected to the second upper voltage level, and a drain connected to the first upper voltage level.

9. The integrated circuit of claim 7 where the input stage comprises:

a first p-channel transistor having its source electrically connected to the second upper voltage level, and its drain electrically connected to a substantially equal electrical state of the input signal to provide the second intermediate output; and a second p-channel transistor having its source electrically connected to the second upper voltage level, its gate connected to the drain of the first p-channel transistor, and its drain connected to the gate of the first p-channel transistor and electrically connected to a substantially opposite electrical state of the input signal to provide the first intermediate output.

10. The integrated circuit of claim 9 where the input stage further comprises an n-channel transistor having its gate connected to the second upper voltage level and its source connected to the drain of the first p-channel transistor.

11. An integrated circuit operating at a first supply voltage level provided by an external power supply comprising:

an internal power supply providing a second supply voltage level;

a voltage level translator comprising an input connection for receiving an input signal having a first Upper signal voltage level equal to the first supply voltage level and a first lower voltage level, and a circuit for producing an output signal in response to the input signal and having a second upper voltage level equal to the second supply voltage level and a second lower voltage level equal to the first supply voltage level; and a boot circuit for receiving the output signal.

12. The integrated circuit of claim 7 where the input stage comprises:

an inverter having an input connected to the input connection for receiving the input signal;

a first p-channel transistor having its source electrically connected to the second upper voltage level, and its drain electrically connected to a substantially opposite electrical state of the input signal to provide the second intermediate output;

a second p-channel transistor having its source electrically connected to the second upper voltage level, its gate connected to the drain of the first p-channel transistor, and its drain connected to the gate of the first p-channel transistor and electrically connected to a substantially equal electrical state of the input signal to provide the first intermediate output; and an n-channel transistor having its gate connected to the first upper voltage level and its drain connected to an output of the inverter.

13. The integrated circuit of claim 7 where the input stage comprises:

an inverter having an input connected to the input connection for receiving the input signal;

a first p-channel transistor having its source electrically connected to the second upper voltage level, and its drain electrically connected to a substantially opposite electrical state of the input signal to provide the second intermediate output;

a second p-channel transistor having its source electrically connected to the second upper voltage level, its gate connected to the drain of the first p-channel transistor, and its drain connected to the gate of the first p-channel transistor and electrically connected to a substantially equal electrical state of the input signal to provide the first intermediate output; and a first n-channel transistor having its gate connected to an output of the inverter, its drain connected to the first lower voltage level, and its source connected to a drain of a second n-channel transistor; and the second n-channel transistor having its gate connected to the first upper voltage level, such that a source voltage of the first n-channel transistor does not exceed the first upper voltage level.

* * * * *

UNITED STATES PATENT AND TRADEMARK OFFICE
CERTIFICATE OF CORRECTION

PATENT NO. : 5,528,173

DATED : June 18, 1996

INVENTOR(S) : Merritt et al.

It is certified that error appears in the above-identified patent and that said Letters Patent is hereby corrected as shown below:

Column 5, line 47, delete "a" and insert therefor -- an --.

Column 5, line 64, delete ", com-".

Column 5, line 65, delete "prises".

Column 7, line 47, delete "Upper" and insert therefor --upper--.

Signed and Sealed this

Fifteenth Day of April, 1997

Attest:

BRUCE LEHMAN

*Attesting Officer*          *Commissioner of Patents and Trademarks*